(12) United States Patent
Shi et al.

(10) Patent No.: US 7,124,395 B2
(45) Date of Patent: Oct. 17, 2006

(54) AUTOMATIC OPTICAL PROXIMITY CORRECTION (OPC) RULE GENERATION

(75) Inventors: Xuelong Shi, Santa Clara, CA (US); Jang Fung Chen, Cupertino, CA (US)

(73) Assignee: ASML Masktools B.V., Veldhoven (NL)

( * ) Notice: Subject to any disclaimer, the term of this patent is extended or adjusted under 35 U.S.C. 154(b) by 265 days.

(21) Appl. No.: 10/626,864

(22) Filed: Jul. 25, 2003

(65) Prior Publication Data

US 2004/0139418 A1 Jul. 15, 2004

(51) Int. Cl.
*G06F 17/50* (2006.01)

(52) U.S. Cl. .............................. 716/19; 716/4; 716/20; 716/21

(58) Field of Classification Search .................... 716/4, 716/19–21
See application file for complete search history.

(56) References Cited

U.S. PATENT DOCUMENTS

| | | | |
|---|---|---|---|
| 5,621,652 A | 4/1997 | Eakin | |
| 5,682,323 A | 10/1997 | Pasch et al. | |
| 5,821,014 A | 10/1998 | Chen et al. | |
| 6,077,310 A | 6/2000 | Yamamoto et al. | |
| 6,078,738 A | 6/2000 | Garza et al. | |
| 6,421,820 B1 | 7/2002 | Mansfield et al. | |
| 6,523,162 B1 * | 2/2003 | Agrawal et al. | 716/19 |
| 6,541,167 B1 | 4/2003 | Petersen et al. | |
| 6,584,609 B1 * | 6/2003 | Pierrat et al. | 716/19 |
| 6,873,720 B1 * | 3/2005 | Cai et al. | 382/149 |
| 2002/0004714 A1 | 1/2002 | Jones et al. | |
| 2003/0082463 A1 | 5/2003 | Laidig et al. | |

FOREIGN PATENT DOCUMENTS

WO     WO 99/14636     3/1999

OTHER PUBLICATIONS

Hewak, Daniel., et al. "Fabrication of tapers and lenslike waveguides by a microcontrolled dip coating procedure." Applied Optics, vol. 27, No. 21, Nov. 1, 1988, pp. 4562-4564.
Torres, J.A., et al. "Contrast-based assist feature optimization photolithography." Optical Microlithography XV, Santa Clara CA, Mar. 5-8, 2002, vol. 4691, pp. 179-187, XP 000118756, ISSN: 0277-786X.

* cited by examiner

*Primary Examiner*—Thuan Do
*Assistant Examiner*—Naum B. Levin
(74) *Attorney, Agent, or Firm*—McDermott Will & Emery LLP

(57) ABSTRACT

A method of automatically applying optical proximity correction techniques to a reticle design containing a plurality of features. The method comprises the steps of: (1) generating a first set of rules for applying scatter bar assist features to the plurality of features for a given illumination setting; (2) generating a second set of rules for applying biasing to the plurality of features for said given illumination setting; (3) forming a look-up table containing the first set of rules and the second set of rules; and (4) analyzing each of the plurality of features with the first set of rules and the second set of rules contained in the look-up table to determine if either the first set of rules or the second set of rules is applicable to a given feature. If either the first set of rules or the second set of rules is applicable to the given feature, the given feature is modified in accordance with the applicable rule.

20 Claims, 8 Drawing Sheets

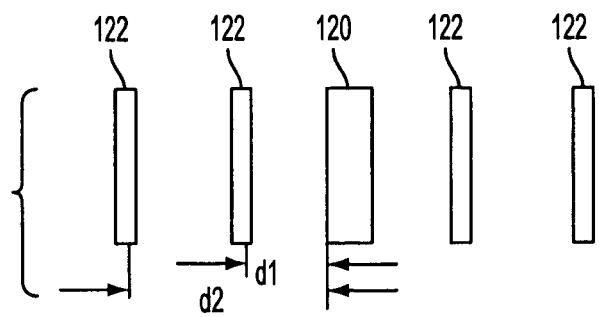
FIG. 2A
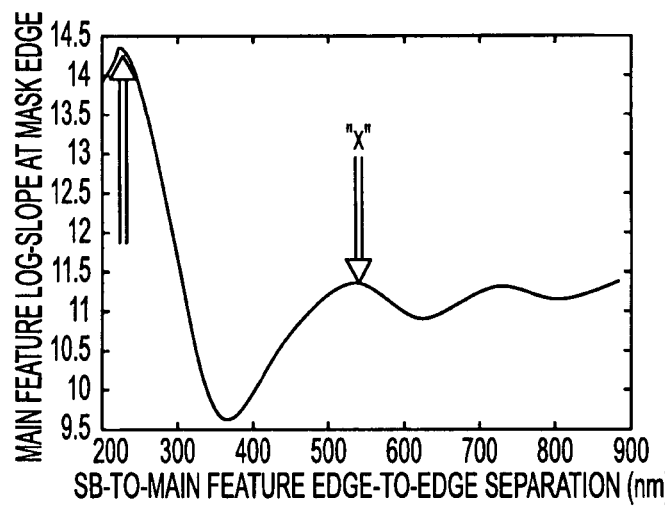
FIG. 2B
| Interval From | Interval End | Grow (nm) | SB1 Style | SB1 Pos | SB1 Size | SB2 Style | SB2 Pos | SB2 Size |
|---|---|---|---|---|---|---|---|---|
| 220 | 235 | -1 | ---- | ---- | ---- | ---- | ---- | ---- |
| 235 | 255 | -2 | ---- | ---- | ---- | ---- | ---- | ---- |
| 255 | 270 | -3 | ---- | ---- | ---- | ---- | ---- | ---- |
| 270 | 280 | -4 | ---- | ---- | ---- | ---- | ---- | ---- |
| 280 | 290 | -5 | ---- | ---- | ---- | ---- | ---- | ---- |
| 290 | 300 | -7 | ---- | ---- | ---- | ---- | ---- | ---- |
| 300 | 310 | -8 | ---- | ---- | ---- | ---- | ---- | ---- |
| 310 | 330 | -10 | ---- | ---- | ---- | ---- | ---- | ---- |
| 330 | 350 | -11 | ---- | ---- | ---- | ---- | ---- | ---- |
| 350 | 370 | -10 | ---- | ---- | ---- | ---- | ---- | ---- |
| 370 | 410 | -11 | ---- | ---- | ---- | ---- | ---- | ---- |
| 410 | 430 | -12 | ---- | ---- | ---- | ---- | ---- | ---- |
| 430 | 480 | -13 | ---- | ---- | ---- | ---- | ---- | ---- |
| 480 | 580 | -14 | ---- | ---- | ---- | ---- | ---- | ---- |
| 580 | 600 | -15 | ---- | ---- | ---- | ---- | ---- | ---- |
| 600 | 612 | -16 | ---- | ---- | ---- | ---- | ---- | ---- |
| 612 | 640 | -9 | cs | ---- | 80 | ---- | ---- | ---- |
| 640 | 850 | -7 | cs | ---- | 80 | ---- | ---- | ---- |
| 850 | 900 | -9 | cs | ---- | 80 | ---- | ---- | ---- |
| 900 | 950 | -11 | cs | ---- | 80 | ---- | ---- | ---- |
| 950 | 972 | -13 | cs | ---- | 80 | ---- | ---- | ---- |
| 972 | 1205 | -7 | ss | 248 | 80 | ---- | ---- | ---- |
| 1205 | 1410 | -5 | ss | 248 | 80 | ---- | ---- | ---- |
| 1410 | 1492 | -4 | ss | 248 | 80 | ---- | ---- | ---- |
| 1492 | inf | -7 | ss | 248 | 80 | ss | 508 | 80 |
FIG. 3

FIG. 7

| LineWidth | Space | Bias (nm) | SB1 Style | SB1 Pos | SB1 Size | SB2 Style | SB2 Pos | SB2 Size | Measured CD | Modeled CD |
|---|---|---|---|---|---|---|---|---|---|---|
| 180 | 300 | 10 | No SB | ----- | ----- | No SB | ----- | ----- | 176.6 | 175.5254 |
| 180 | 340 | 20 | No SB | ----- | ----- | No SB | ----- | ----- | 186.2 | 182.3602 |
| 180 | 380 | 20 | No SB | ----- | ----- | No SB | ----- | ----- | 173.5 | 178.859 |
| 180 | 420 | 20 | No SB | ----- | ----- | No SB | ----- | ----- | 168.4 | 173.1874 |
| 180 | 460 | 20 | No SB | ----- | ----- | No SB | ----- | ----- | 170.9 | 170.8066 |
| 180 | 500 | 20 | CS | ----- | ----- | No SB | ----- | ----- | 167.3 | 170.7253 |
| 180 | 620 | 20 | CS | ----- | 80 | No SB | ----- | ----- | 187.2 | 184.7691 |
| 180 | 660 | 20 | CS | 240 | 80 | No SB | ----- | ----- | 181.9 | 186.9349 |
| 180 | 700 | 0 | SSB | ----- | 80 | No SB | ----- | ----- | 156.2 | 160.6056 |
| 180 | 700 | 20 | No SB | ----- | 80 | No SB | ----- | ----- | 183.8 | 188.6791 |
| 180 | 5500 | 0 | No SB | ----- | ----- | No SB | ----- | ----- | 166.2 | 168.6743 |
| ----- | ----- | 0 | No SB | ----- | ----- | No SB | ----- | ----- | ----- | ----- |
| ----- | ----- | 0 | No SB | ----- | ----- | No SB | ----- | ----- | ----- | ----- |
| ----- | ----- | 0 | No SB | ----- | ----- | No SB | ----- | ----- | ----- | ----- |

Print   Load File   Start
        Save File   Exit

Calibration Goodness Check

AUTOMATIC OPTICAL PROXIMITY CORRECTION (OPC) RULE GENERATION

FIELD OF THE INVENTION

The present invention generally relates to photolithography, and in particular to a method of generating a set of rules for automatically applying optical proximity correction techniques to a mask pattern to be imaged on a substrate.

The present invention also relates to the use of such a calibration technique in a lithographic projection apparatus, which generally comprises:
- a radiation system for supplying a projection beam of radiation;
- a support structure for supporting patterning means (e.g., mask), the patterning means serving to pattern the projection beam according to a desired pattern;
- a substrate table for holding a substrate; and
- a projection system for projecting the patterned beam onto a target portion of the substrate.

BACKGROUND OF THE INVENTION

Lithographic apparatus can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or the smallest space between two lines. Thus, the CD determines the overall size and density of the designed circuit.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD of its corresponding mask pattern approaches the resolution limit of the optical exposure tool. The resolution for an exposure tool is defined as the minimum feature that the exposure tool can repeatedly expose oh the wafer. The resolution value of present exposure equipment often constrains the CD for many advanced IC circuit designs.

As the critical dimensions of the circuit layout become smaller and approach the resolution value of the exposure tool, the correspondence between the mask pattern and the actual circuit pattern developed on the photoresist layer can be significantly reduced. The degree and amount of differences in the mask and actual circuit patterns depends on the proximity of the circuit features to one another. Accordingly, pattern transference problems are referred to as "proximity effects."

To help overcome the significant problem of proximity effects, a number of techniques are used to add sub-lithographic features to mask patterns. Sub-lithographic features have dimensions less than the resolution of the exposure tool, and therefore do not transfer to the photoresist layer.

Instead, sub-lithographic features interact with the original mask pattern and compensate for proximity effects, thereby improving the final transferred circuit pattern.

Examples of such sub-lithographic features are scattering bars and anti-scattering bars, such as disclosed in U.S. Pat. No. 5,821,014 (incorporated herein by reference), which are added to mask patterns to reduce differences between features within a mask pattern caused by proximity effects. More specifically, sub-resolution assist features, or scattering bars, have been used as a means to correct for optical proximity effects and have been shown to be effective for increasing the overall process window (i.e., the ability to consistently print features having a specified CD regardless of whether or not the features are isolated or densely packed relative to adjacent features). As set forth in the '014 patent, generally speaking, the optical proximity correction occurs by improving the depth of focus for the less dense to isolated features by placing scattering bars near these features. The scattering bars function to change the effective pattern density (of the isolated or less dense features) to be more dense, thereby negating the undesirable proximity effects associated with printing of isolated or less dense features. It is important, however, that the scattering bars themselves do not print on the wafer.

For the intermediate pitch features pitches, where there is no room to insert SB, a typical method of optical proximity correction (OPC) is to adjust the feature edges (or apply bias) so that the printed feature width is closer to the intended width. In order for the use of the sub-resolution features and/or feature biasing to be effective for minimizing optical proximity effects, an operator having a substantial amount of knowledge regarding mask design and the printing process, as well as a substantial amount of experience, is required to modify the mask design to include the sub-resolution features and/or the adjustment of feature edges (biasing) if the desired goal is to be obtained. Indeed, even when an experienced operator performs this task, it is often necessary to conduct a "trial and error" process in order to properly position the subresolution features to obtain the desired corrections. This is in part due to the fact that OPC rules are not universal in that the optimal solutions vary with the illumination settings of the imaging system, the type of resist, as well as other process factors. As such, the trial and error process, which can entail repeated mask revisions followed by repeated simulations, can become both a time consuming and costly process.

Accordingly, there exists a need for a method of automatically generating a set of rules for applying OPC techniques to a given mask design that eliminates the need for the time consuming and costly trial and error process that is typically performed when modifying a mask design to include OPC techniques, and that eliminates the need for an experienced mask designer to be involved in the process in order to obtain effective results.

SUMMARY OF THE INVENTION

In an effort to solve the aforementioned needs, it is an object of the present invention to provide a method of generating a set of rules which allow for the automatic application of optical proximity correction techniques to a reticle design so as to eliminate the need for the trial and error process previously utilized to determine the application of OPC techniques and to eliminate the need for an experienced mask designer to be involved in the design process.

More specifically, the present invention relates to a method of generating a rule set utilized for automatically applying optical proximity correction techniques to a reticle design containing a plurality of features. The method comprises the steps of generating a first set of rules for applying scatter bar assist features to the plurality of features for a given illumination setting; generating a second set of rules for applying biasing to the plurality of features for said given illumination setting; and forming a look-up table containing the first set of rules and the second set of rules.

In addition, the present invention relates to a method of automatically applying optical proximity correction techniques to a reticle design containing a plurality of features. The method comprises the steps of: (1) generating a first set of rules for applying scatter bar assist features to the plurality of features; (2) generating a second set of rules for applying biasing to the plurality of features; (3) forming a look-up table containing the first set of rules and the second set of rules; and (4) analyzing each of the plurality of features with the first set of rules and the second set of rules contained in the look-up table to determine if either the first set of rules or the second set of rules is applicable to a given feature. If either the first set of rules or the second set of rules is applicable to the given feature, the given feature is modified in accordance with the applicable rule (or rules, if both the first and second rules are applicable).

As described in further detail below, the present invention provides significant advantages over the prior art. Most importantly, the method of the present invention eliminates the need for performing an extensive trial and error process to determine how to apply OPC techniques to a mask design, which is both costly and time consuming. Furthermore, the present invention eliminates the need for an experience mask designer to be involved with the application of the OPC techniques to the mask design.

Additional advantages of the present invention will become apparent to those skilled in the art from the following detailed description of exemplary embodiments of the present invention.

Although specific reference may be made in this text to the use of the invention in the manufacture of ICs, it should be explicitly understood that the invention has many other possible applications. For example, it may be employed for photomask patterning calibration and photo resist modeling, and wafer etched pattern modeling, and in general for 2D pattern calibration applications such as integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other patterning calibration purposes that include:

a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference.

a programmable LCD array. An example of such a construction is given in U.S. Pat. No. 5,229,872, which is incorporated herein by reference.

The invention itself, together with further objects and advantages, can be better understood by reference to the following detailed description and the accompanying schematic drawings.

BRIEF DESCRIPTION OF THE DRAWINGS

FIGS. 2a and 2b illustrate an exemplary placement of scatter bars adjacent a main feature and the corresponding aerial image, respectively.

FIG. 3 illustrates a look-up table embodying an exemplary OPC rule set generated in accordance with the method of the present invention.

FIGS. 6 and 7 are experimental results validating the method of the present invention.

DETAILED DESCRIPTION OF THE INVENTION

In accordance with the present invention, a method is disclosed for generating a set of rules (referred to as the OPC rule set) for automatically defining how a mask design should be modified to include OPC techniques for improving printing performance. Such OPC techniques, include, but are not limited to scatter bar assist features, feature biasing and serif placement. As explained below, once the OPC rule set has been generated for a given illumination setting, any reticle design can be automatically modified to include OPC techniques based on the OPC rule set. As such, there is no need to perform a trial and error placement for each mask design in order to modify the mask to include OPC techniques. However, a new OPC rule set needs to be generated each time the illumination setting or the resist process is changed.

Figure 1:
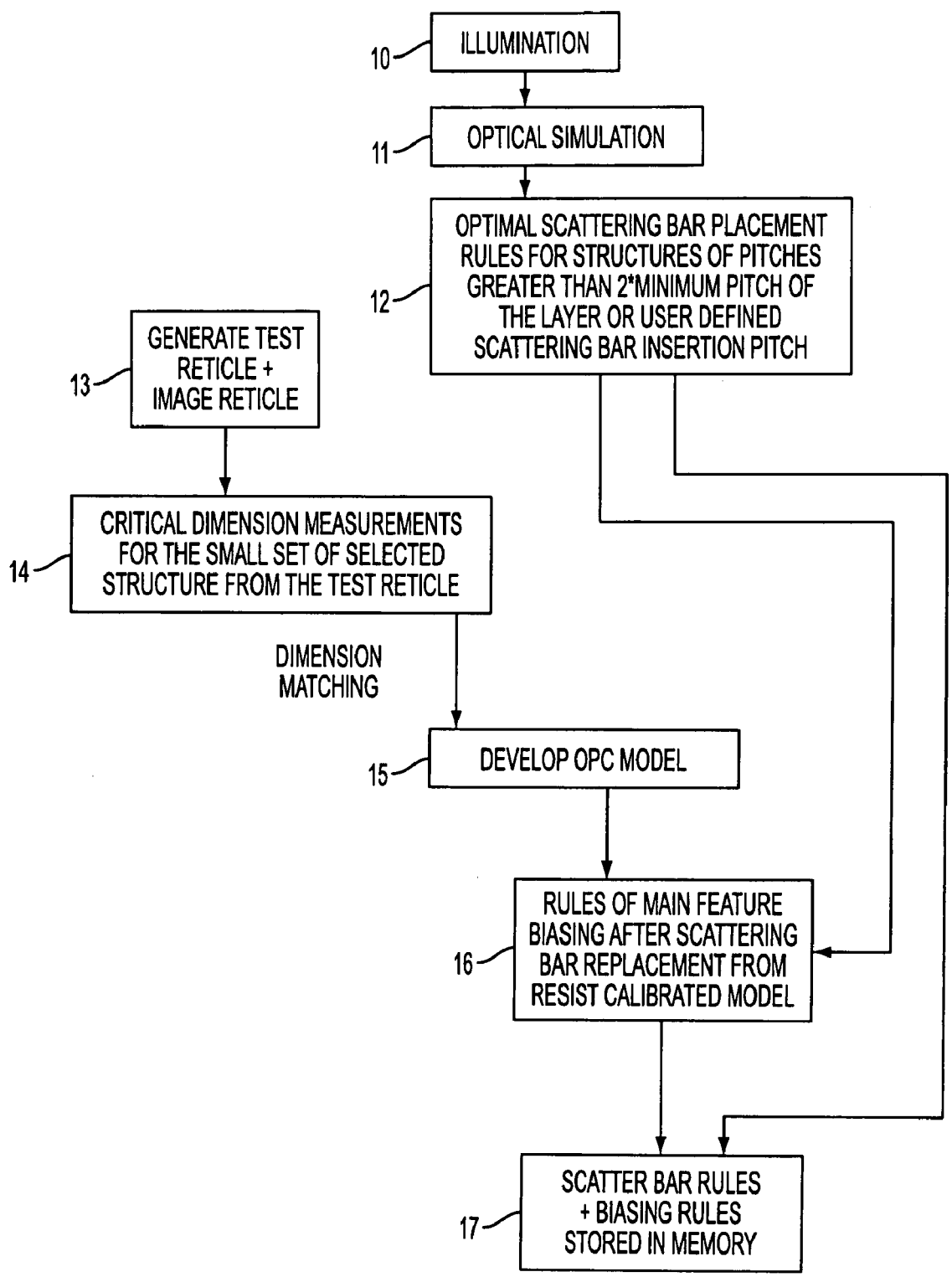
FIG. 1 is a flow chart illustrating an exemplary embodiment of the method for generating an OPC rule set in accordance with the present invention.

FIG. 1 is a flow chart illustrating an exemplary embodiment of the method for generating the OPC rule set in accordance with the present invention. As an overview, the rule generation process of the present invention entails essentially three main steps. The first is to compute rules governing the optimal placement of the scatter bar assist features relative to the features within the reticle. The second step entails the determination of rules governing the amount of feature bias for a feature based on the location of the given feature relative to adjacent features or assist features. The final step is to compute rules governing line end corrections. It is noted that while the present embodiment of the invention describes generating rules for governing the application of the foregoing OPC techniques, it is not intended that the present invention be so limited. Additional OPC techniques could be embodied in rules utilizing the methodology disclosed herein.

With regard to the first step in the rule generation process, which entails generating rules governing the placement of scatter bars, for isolated features, the placement of scatter bars around such features can be done with a great deal of freedom. It is noted that a general rule of thumb for defining "isolated features" is that the feature is considered isolated if the nearest neighboring feature is approximately $7*\lambda/(NA \cdot (1+\sigma_{outer}))$ or greater, where NA is the numerical aperture, $\lambda$ is the wavelength of the imaging light and $\sigma$ is the outer sigma or partial coherence. The optimal position of the scatter bars relative to the features can be determined by performing optical simulations, independent of the resist process.

It is noted that the addition of scatter bars around isolated features improves the depth of focus (DOF) for the isolated features, and this DOF improvement is not exceptionally sensitive to variations in the placement of the scatter bars within a certain range. However, the exposure latitude (EL) is sensitive to variations in the placement of scatter bars. Accordingly, it is preferable to position the scatter bars at locations that the log-slope of the main feature aerial image achieves a maximum value, as shown in FIG. 2a. Referring to FIG. 2a, the main feature 120 has two scatter bars 122 placed approximate each side of the main feature. As stated, preferably, the scatter bar 122 closest to the main feature 120 is placed at a distance from the main feature at which the main aerial image log slope achieves a maximum. FIG. 2b illustrates an aerial image corresponding to the pattern in FIG. 2a. Accordingly, in the given example, the distance between the main feature 120 and the scatter bar 122 adjacent thereto is approximately 540 nm as denoted by arrow "X" in FIG. 2b. It is noted that the second scatter bar (i.e., the scatter bars separated by a distance d2 as shown in FIG. 2a) would be positioned at the second maximum.

For the intermediate pitch structures, the degree of freedom with regard to scatter bar placement depends on the pitch between the features. It is noted that an intermediate pitch is considered one for which only a single (centered) scatter bar can be applied due to limited space between neighboring main features. It is noted that for structures with pitches around twice the forbidden pitch (i.e., the forbidden pitch corresponds to pitch values in which the resulting exposure latitude is exceedingly poor under certain illumination conditions), scatter bar insertion can result in loss of exposure latitude, while the DOF is improved. For such cases, whether or not scatter bars should be inserted depends on whether the original design data already contained such structures. Finally, as is known, typically for features closely spaced together (i.e., dense pitch), scatter bars are not utilized. As a rule of thumb, the minimum pitch that center scatter bars can be inserted into the design is when the pitch=1.2·(2·min. space on design)+feature width+scatter bar width or greater. The foregoing rule of thumb does provide a level of margin regarding the printing of the scatter bar. However, a simulation should be utilized to verify that the scatter bars do not print under the given process conditions.

Referring again to FIG. 1, the process of defining the rules for the placement of scatter bars is set forth in Steps 10–12. Specifically, in Step 10 the type of illumination to be utilized in the imaging process is defined by the user. Such illuminations include, but are not limited to, quadrapole, dipole, annular, etc. Once the illumination has been defined, an optical simulation (Step 11) is performed on a test structure that contains, for example, an isolated main feature with a pair of scatter bars around it. Once the aerial image is defined, it is a relatively simple process to identify the optimal placement of the scatter bars (Step 12). For example, one technique as described above is to position scatter bars at locations that the log-slope of the aerial image of the feature achieves a maximum value. The user can also define the minimum pitch necessary between features before scatter bars are disposed between features. Of course, other methods of determining the optimal placement of scatter bars for a given illumination are also possible. The end result of Step 12 is a set of rules governing the optimal placement of scatter bars for features with pitches having enough space for scatter bar placement for the given illumination defined in Step 10. In the given embodiment, the resulting rules define whether scatter bars are placed between features residing in given pitch intervals.

It is noted that in the current embodiment of the present invention, the width of the scatter bar is fixed depending on the main feature size. As an example, for a 130 nm technology, the scatter bar width is approximately 80 nm.

Specifically, as shown in Table 1 shown in FIG. 3, the resulting rule set governing scatter bar placement defines when and where to position scatter bars within the mask based on the pitch between the features. Referring to the exemplary data shown in Table 1, for example, for pitches between 220 to 235 nm, no scatter bars are utilized. Similarly, for pitches between 600–612 nm, no scatter bars are utilized. However, for pitches between 972–1205 nm, a single scatter bar having a width of 80 nm is placed adjacent the scatter bar at a distance of 248 nm from the feature edge. Finally, for pitches of 1492 nm or greater, two scatter bars are placed adjacent the edge of the feature, the first at a distance of 248 nm away and the second at a distance of 508 nm away from the feature edge, with both of the scatter bars having a width of 80 nm.

It is noted that in Table 1 shown in FIG. 3, the "Interval From" and "Interval End" column identifies the space (i.e., distance) between the edges of the nearest main features. The "Grow" column identifies the bias applied to the edges of the feature (residing within the given pitch range). A minus value in the grow column indicates that the space between the features shrinks (i.e., the feature grows). "CS" refers to a center scatter bar, which is placed in the center of the space between two features. "SS" refers to side scatter bar. It is noted that when a center scatter bar is utilized, there is no need to specify the scatter bar position "SB Pos" because the scatter is placed in the middle of the space between the features.

Once the scatter bar placement rules have been determined, the next step in the process is to generate a set of rules governing the biasing of the features contained in the reticle to be imaged. In other words, generating a set of rules for optimally biasing the main features. As is known, the amount of bias to be applied to a given feature depends on the surrounding structure as well as the resist and process being utilized to image the reticle. Prior to the present invention, the determination of the necessary biasing was typically accomplished by imaging a large number of test structures, and then determining the required biasing by examining the resulting wafers. In contrast, in accordance with the present invention, the amount of main feature biasing for different structures is reliably determined from a model representing the performance of the imaging system and the resist, which is calibrated utilizing a small set of experimental data. It is noted that the model utilized for calibrating the photolithography process (i.e., optical imaging plus resist response) can be either a physical model or an empirical model.

The physical model is based on simulating process steps sequentially, from aerial imaging (i.e., light intensity distribution) to latent imaging (i.e., chemical intensity distribution), to a final developed image. Such physical models involve simulations for chemical kinetics and material diffusion during post exposure baking process, as well as simulations for resist development. As such, relative to an empirical model, the simulation speed using such physical models is slower. It is noted that the accuracy of the simulation is dependent on the model itself and the parameters obtained from the experimental data.

In contrast, the empirical model considers the process as a whole, and this process is characterized by a function, which represents the imaging process as a whole. This function operates to convert the two dimensional binary image of the reticle pattern into a binary resist developed image pattern. Due to the mathematical foundation of the empirical model, the simulation speed is considerably faster when compared to the physical model. It is noted that the method of the present invention is not intended to be limited to either of the foregoing models discussed above. Indeed, any model capable of providing accurate feature biasing requirements could be incorporated into the methodology of the present invention.

Referring again to FIG. 1, Steps 13–16 illustrate the steps associated with generating the set of rules governing the biasing of the features. The first step (Step 13) is to generate a test reticle comprising a small set of selected features, and to image the test reticle on a substrate using the illumination settings to be utilized when imaging the actual production reticle. It is noted that we need to use the same illumination settings that will be utilized to image the actual reticle when we image the test reticle. The number of selected features should include features having a range of various pitches, preferably pitches expected to be present in the actual reticle. For example, the features on the test reticle can include, densely-spaced features, semi-isolated features, isolated features, line-ends and elbows, etc. Once the selected features on the test reticle are printed, the selected features are measured so as to determine the actual dimensions of the selected features as imaged on the substrate. In other words, the critical dimension measurements of the selected features are taken (Step 14). The measurement of the selected features imaged on the substrate can be performed, for example, by utilizing a top-down scanning electron microscope (SEM), or a cross-section critical dimension (CD) microscope.

The next step in the process (Step 15) requires developing an OPC model that accurately represents the combined response of the imaging system and the resist. This can be accomplished by comparing the difference between the original test reticle and the imaging results of the test reticle obtained in Step 14, and generating a function which accurately represents the differences between the original design and the resulting design. This function defines the printing performance of the given imaging system and the resist. Once the function is defined, it is possible to adjust the biasing of features contained in a reticle so as to compensate for performance variations due to the imaging system or resist. In other words, once the function (i.e., model) is generated, the imaging system and resist performance is effectively defined as a mathematical equation. This equation is then utilized to determine a set of rules (i.e., OPC rule set) governing the biasing required for features contained in a reticle. In the given embodiment, once the calibration model is generated, a series of varying feature pitches are run through the model to generate the biasing rules for the different pitches.

One such function or model for representing the performance of the imaging system and resist is a system pseudo-intensity function, or SPIF, which can be expressed as:

$$SPIF(x, y) = \sum_{i=1}^{n} \alpha_i |M(x, y) * \Psi_i(x, y)|^2$$

where, $\alpha_i$ is a weighting coefficient to be calibrated and optimized;

$M(x, y)$ is the mask transmission function;

$\Psi_i(x, y)$ is the set of basis functions that have been chosen to represent optical imaging system, e.g., the Eigen functions of a theoretical optical-system;

x, y are the location of wafer pattern; and

* is the convolution operator.

In accordance with the present invention, once the SPIF function (i.e., the OPC model) is defined by comparing the difference between the target design contained on the test reticle and the actual results obtained by imaging the test reticle, the printing performance of the given imaging system and the resist is known. The OPC model is then utilized to generate biasing rules for the numerous features that may be contained in a given reticle design (Step 16). Thus, from only a small sample of test patterns, it is possible to generate a rule set defining the biasing for numerous features of different size and pitch.

One process for generating the rule set is as follows. The first step (1) is to generate a series of test structures that are internal to the software program, with varying pitches, for example, in 5 m or 10 nm increments. Then, step (2), starting from the tightest pitch structure (i.e., smallest pitch), utilize the calibrated model to calculate the required biasing limits (lowest_bias, highest_bias) for any given test structure generated in step (1), so that if a bias is applied, where lowest_bias<=bias<=highest_bias, then the printing dimension of that structure will be within predetermined limits (i.e., between the target_CD minus the allowed_CD_tolerance, and target_CD plus allowed_CD_tolerance). The allowed_CD_tolerance can be defined by the user, and 10% of the main feature size is a typical value. The target_CD and allowed_CD_tolerance is universal to all structures, while the lowest_bias and highest_bias is structure specific (i.e. every structure of a given pitch has its own lowest_bias and highest_bias values). In step (3), after finishing calculating all the lowest_bias and highest_bias values for all the test structures generated in step (1), a grouping step is performed so as to group various pitches having similar biasing requirements into a single biasing rule. For example, if there are three structures of pitches closely sequenced, say, 620 nm, 630 n, and 640 nm, and assuming their bias limits are (4,8), (5,9), (6,10), respectively, then it is possible to set the common limits for these three pitches as (6,8), and use the average of the common limit, 7, as the common bias in the rule for structures with pitch from 620 nm to 640 nm.

Importantly, when generating the biasing rules for the various ranges of pitches and feature sizes contained in the design, the scatter bar placement as defined by the rule set computed in Step 12 is taken into account, because placement of scatter bars effects biasing requirements. In other words, when computing the biasing rules, if for the given pitch, a scatter bar would be added to the design, then the scatter bar is added to the design prior to computing the biasing requirements for features within the given pitch range. The end result of Step 16 is a set of rules governing the biasing of the features over the various pitch ranges expected to be utilized in actual designs.

Specifically, referring again to Table 1 of FIG. 3, in the current embodiment, the resulting rule set governing biasing defines when and how to bias main features within the mask, on a pitch-interval by pitch-interval basis. As noted above, the "interval from" to "interval end" indicates a given pitch, "grow" indicates the bias applied for features with the given pitch range, "SB1" indicates the given type of the first scatter to be utilized in the given pitch range, "SB1 pos" indicates the position of the first scatter bar relative to the feature edge, "SB1 size" indicates the size of the first scatter bar, "SB2" indicates the given type of the second scatter to be utilized in the given pitch range, "SB2 pos" indicates the position of the second scatter bar relative to the feature edge, and "SB2 size" indicates the size of the second scatter bar. Upon completion of the generation of the biasing rules and the scatter bar placement rules, in the final step in the process, the rules are stored in memory (Step 17), for example, in the form of a look-up table as shown in FIG. 3.

It is noted that, as an optional step in the process, the operator can perform additional verification of the foregoing OPC rule set by either using simulation tools or experimental testing. The additional verification would serve to verify that the OPC rule set results in the generation of OPC that causes the features to print within the defined specifications regarding tolerance. Of course, if necessary, the operator could make minor adjustments to the rule set if necessary to optimize OPC performance. Once the rule set is verified, the operator can utilize the rule set to modify the design data for any given mask in order to automatically provide a mask design which includes OPC features.

In a variation of the foregoing process, the present invention also generates a rule set governing the treatment of line ends in the reticle design. In other words, a rule set which indicates how to modify line ends to compensate for shortening thereof during the printing process. As is known, possible modifications to line ends include lengthening lines, addition of serifs, etc.

Figure 4:
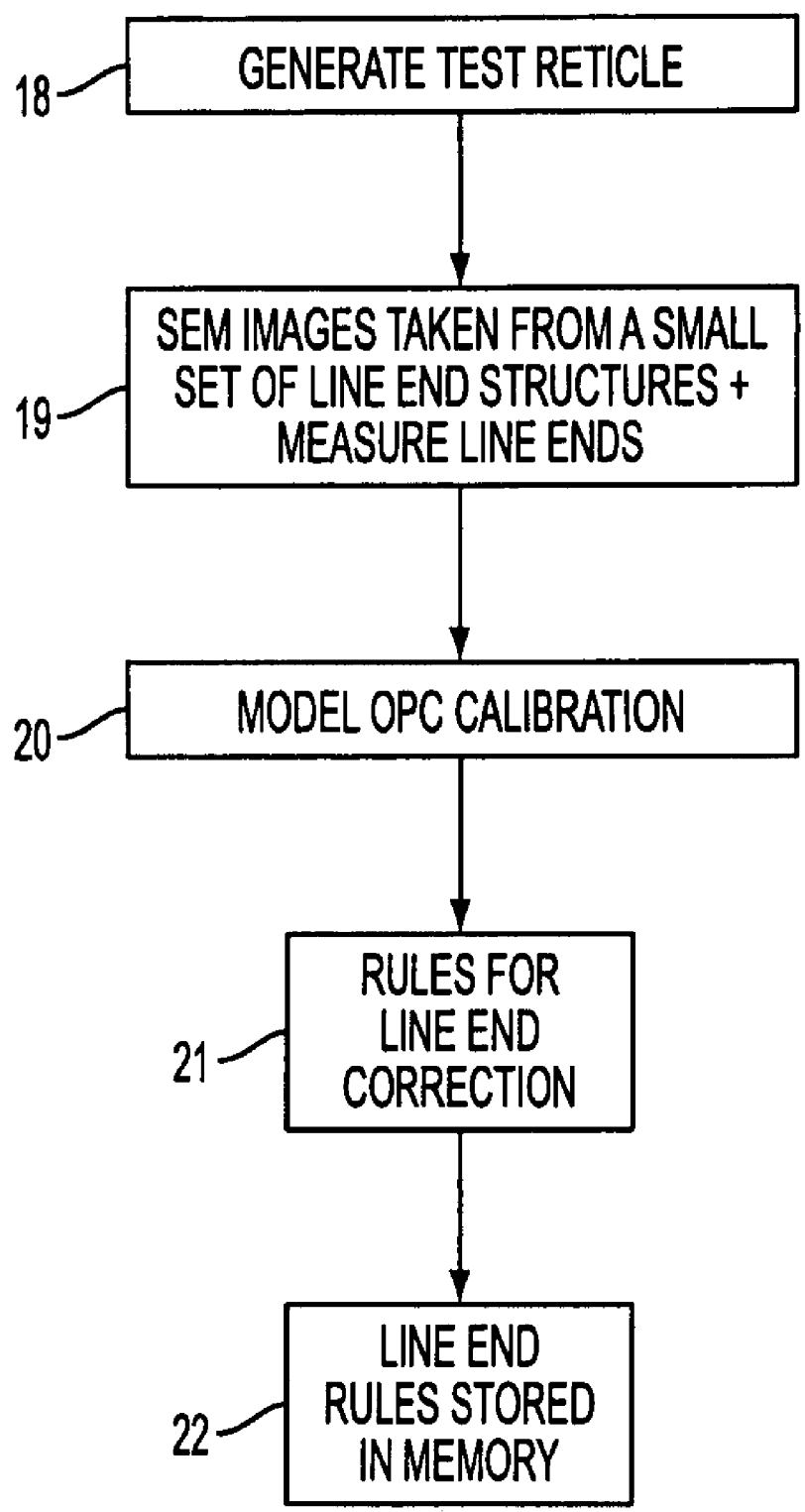
FIG. 4 is a flow chart illustrating an exemplary embodiment of the method for generating an OPC rule set regarding line end correction.

Referring to FIG. 4. similar to the generation of the biasing rules, the first step (Step 18) in the line end rule generation process is to generate a test reticle comprising a small set of line end structures, and to image the test reticle (Step 19) on a substrate using the illumination settings to be utilized when imaging the actual reticle. It is noted that the test reticle should include line end features having different spacing relative to adjacent features, and different widths, and also vary along the X-axis, y-axis, 45° axis and 135° axis. Of course, it is also possible to include the line end test structures on the test reticle associated with the generation of the biasing rules. Once the line ends on the test reticle are printed, the selected features are measured so as to determine the actual dimensions of the line ends. The measurement of the line ends imaged on the substrate can be performed, for example, by utilizing a top-down scanning electron microscope (SEM), or a cross-section critical dimension (CD) microscope.

Thereafter, in the same manner as discussed above with regard to Step 15, in Step 20 an OPC model that accurately represents the combined response of the imaging system and the resist with regard to line ends is generated. Once again, this can be accomplished by comparing the difference between the original test reticle and the imaging results of the test reticle obtained in Step 19, and generating a function which accurately represents the differences between the original design and the resulting design. The above-identified SPIF function can also be utilized for representing performance regarding line end shortening. Once the function is defined, it is possible to adjust the line ends contained in a reticle so as to compensate for performance variations due to the imaging system or resist. In other words, the function is then utilized to determine a set of rules governing the line end compensation for features contained in a reticle (Step 21). The rules are then stored in memory (Step 22). It is noted that if line end analysis is to be performed, the original test reticle can contain both test features and line ends and only a sole SPIF function need be generated to represent the performance of the system and resist with regard to biasing and line end performance.

Figure 5:
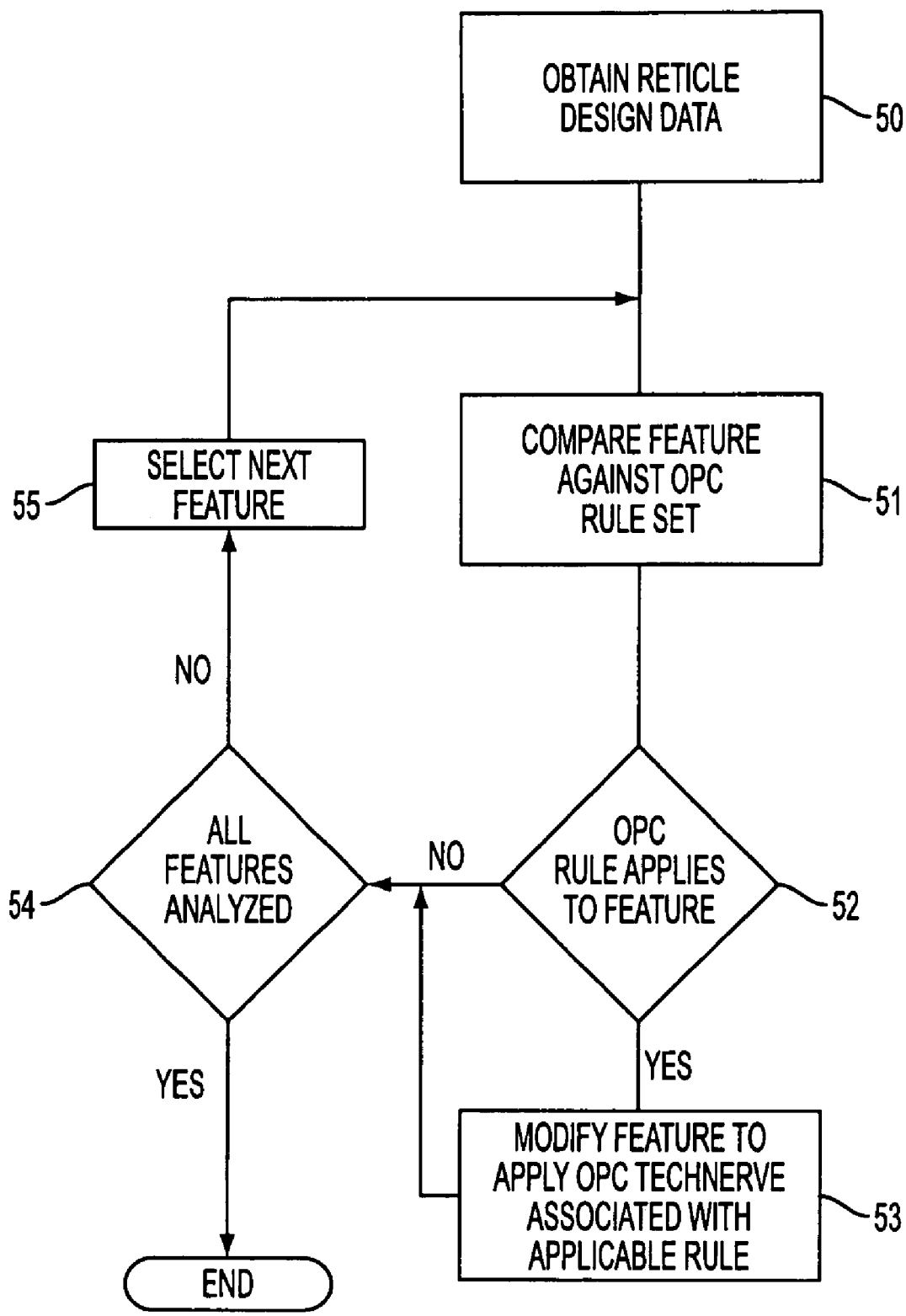
FIG. 5 is a flow chart illustrating an exemplary process of automatically applying an OPC rule set to a given reticle design in accordance with the present invention.

Once all of the rules are generated, as stated, the rules are compiled in a file in memory, wherein in the given embodiment for each given pitch range, the biasing adjustment, and scatter bar requirements are defined (and line end adjustment if applicable). Thus, the rules essentially form a look-up table to specify how each feature within a given pitch can be modified. As a result of the generation of this look-up table, the process of applying OPC to a given reticle design can be performed is a simple, automated manner. The process is illustrated in the exemplary flowchart set forth in FIG. 5.

As shown, the first step in the process (Step 50) is to obtain the reticle design in a data format. GDSII Stream™ is one commonly used data format in the semiconductor industry. However, any other suitable data format capable of representing mask designs can be utilized. Next, each feature within the reticle design is analyzed so as to determine, for example, the pitch of the given feature within the design (Step 51), and then based on the pitch, the corresponding pitch is identified in the OPC table containing the rules (as shown in FIG. 4) and the feature design is modified in accordance with the biasing requirement and scatter bar set forth in the table for the given pitch, if applicable (Steps 52 and 53). This process is continued until all features within the design have been analyzed (Steps 54 and 55) and modified if necessary. The modified features contained within the design represent the reticle to be printed, with OPC applied to all features requiring such correction. Thus, once the OPC rules have been generated in the manner set forth above, it is possible to automatically modify a reticle design to include OPC techniques without any further input from a mask designer.

Figure 6:
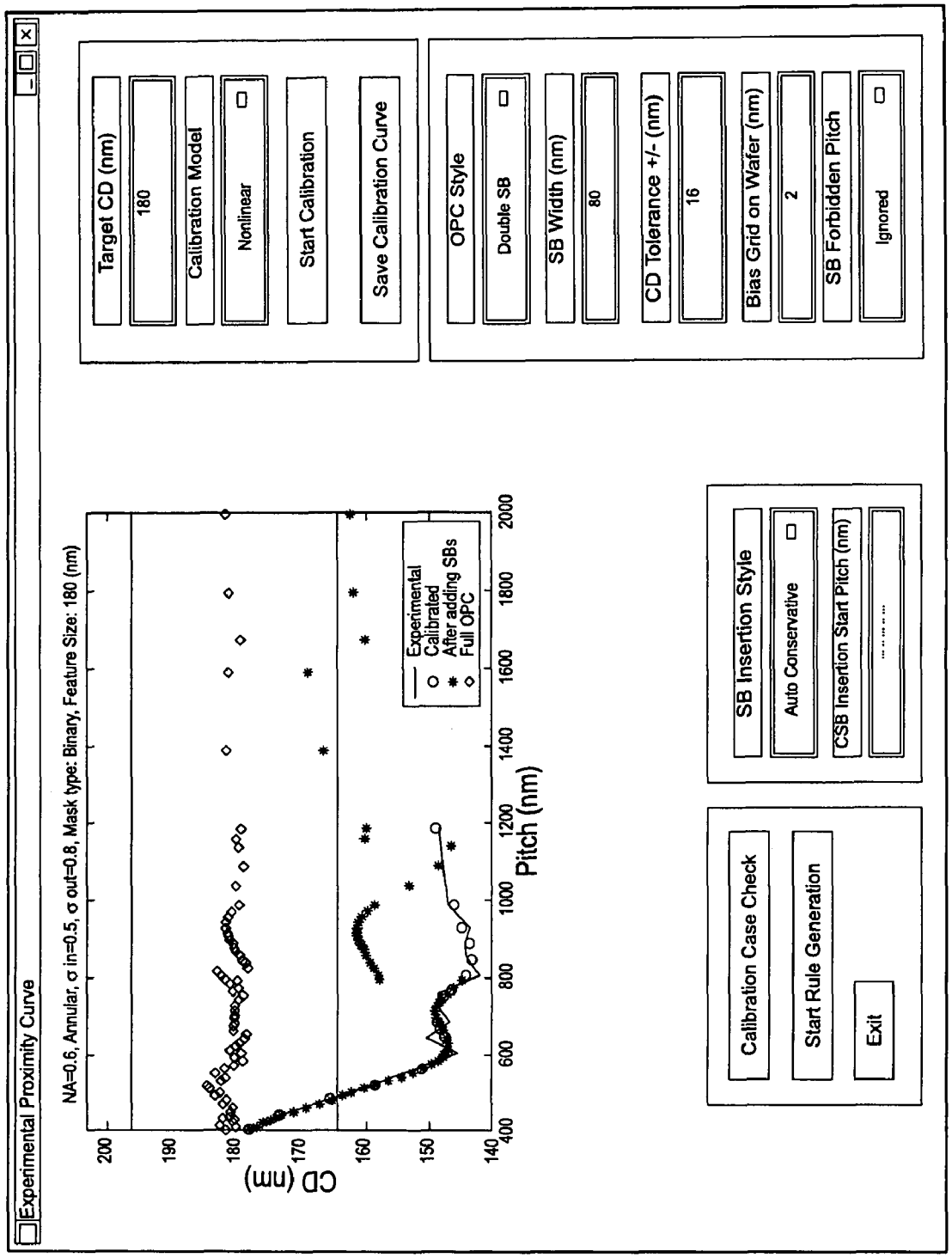
Figure 8:
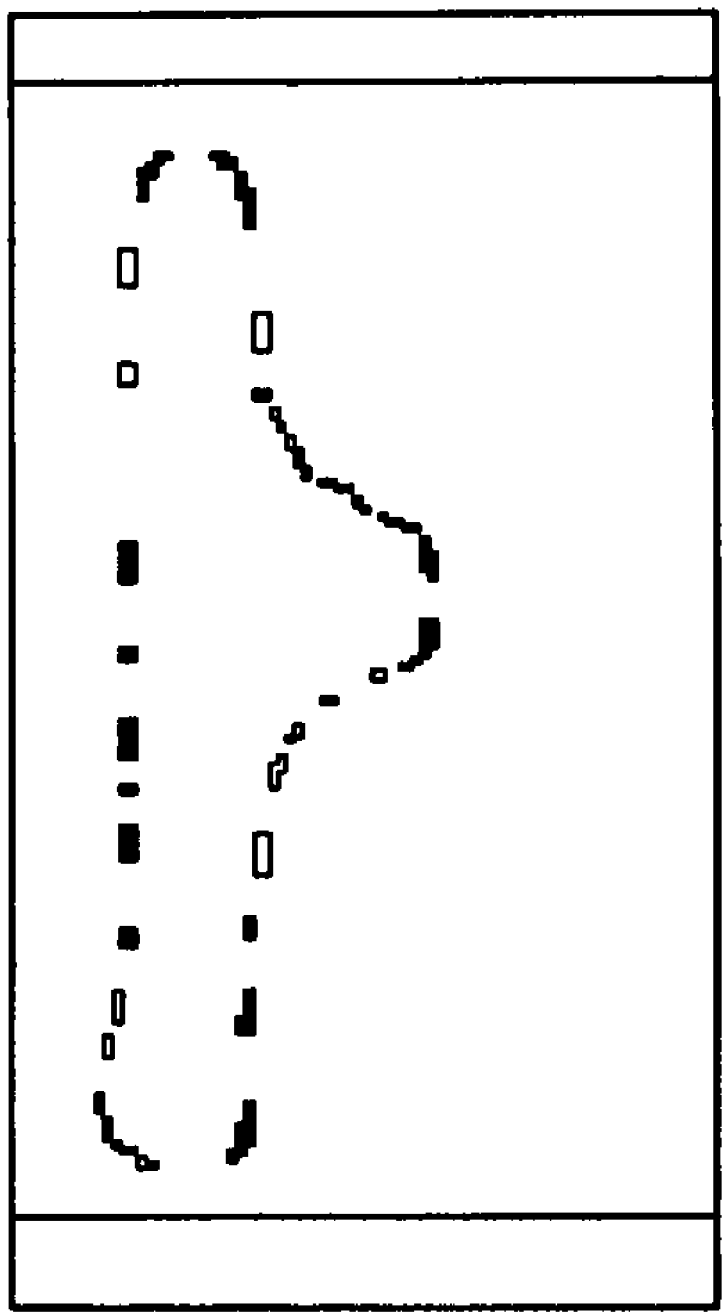
FIG. 8 illustrates experimental results of the method of the present invention with regard to line end correction.

The applicability and effectiveness of the method of the present invention was verified via an experimental test, the results of which are shown in FIGS. 6 and 7. FIG. 8 illustrates the results of the line end correction applied to a reticle in accordance with the present invention. Specifically, FIG. 8 illustrates the difference between the calibrated model prediction and the experimental image. Area 81 (the black area) indicates where the model under predicts and area 82 (the white area) indicates where the model over predicts.

As described above, the present invention provides significant advantages over the prior art. Most importantly, the method of the present invention eliminates the need for performing an extensive trial and error process to determine how to apply OPC techniques to a mask design, which is both costly and time consuming. Furthermore, the present invention eliminates the need for an experience mask designer to be involved with the application of the OPC techniques to the mask design.

Figure 9:
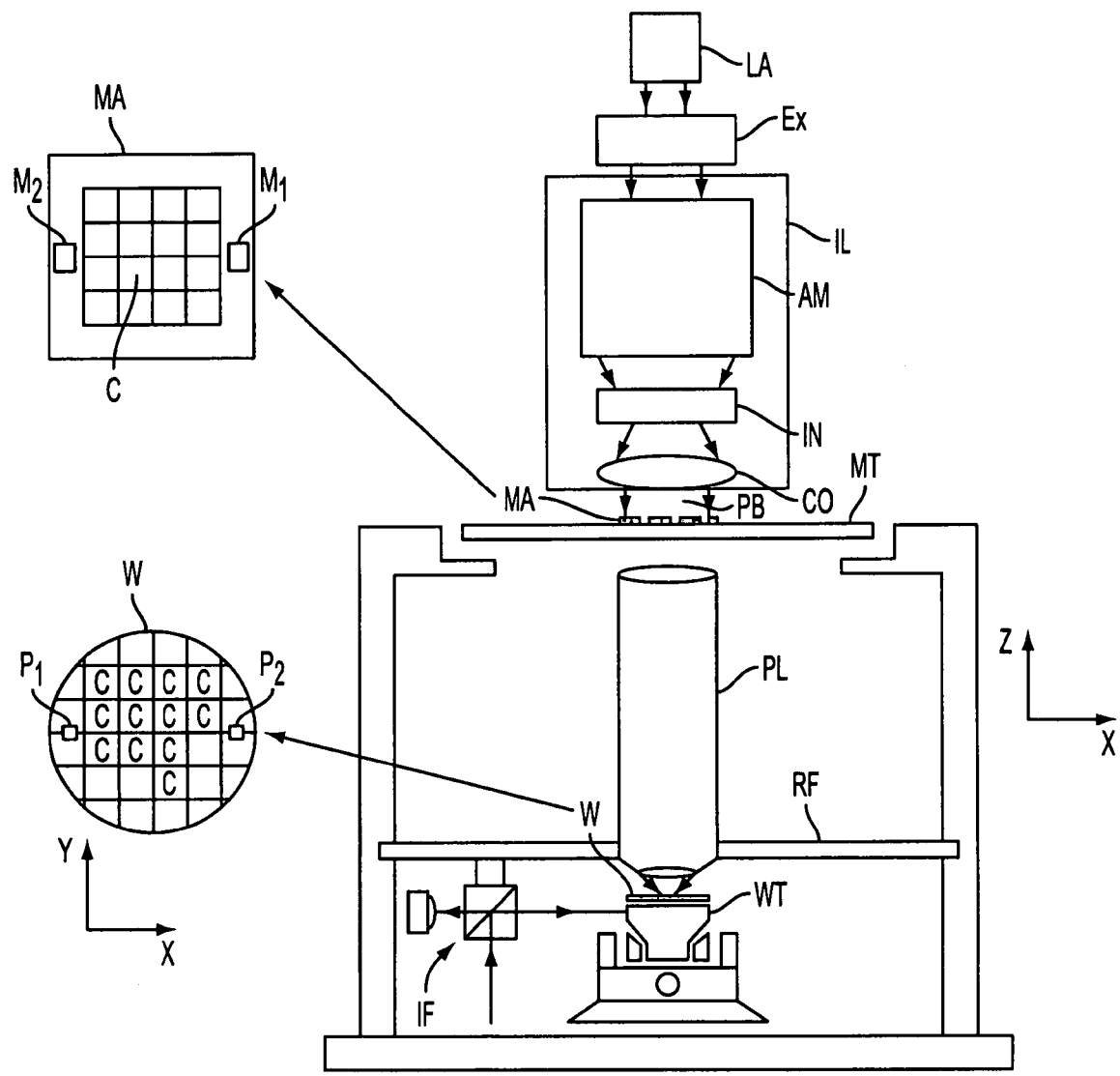
FIG. 9 schematically depicts a lithographic projection apparatus suitable for use in conjunction with the method of the present invention.

FIG. 9 schematically depicts a lithographic projection apparatus suitable for use with the calibration method of the present invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 9 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 9. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A method of generating a rule set utilized for automatically applying optical proximity correction techniques to a reticle design containing a plurality of features, said method comprising the steps of:
    generating a first set of rules for applying scatter bar assist features to said plurality of features for a given illumination setting, said first set of rules being generated utilizing a simulation process;
    generating a second set of rules for applying biasing to said plurality of features for said given illumination setting, said second set of rules being generated utilizing a model representing printing performance; and
    forming a look-up table containing said first set of rules and said second set of rules.

2. The method of generating a rule set utilized for automatically applying optical proximity correction techniques to a reticle design containing a plurality of features according to claim 1, wherein said step of generating said first set of rules comprises the steps of:
    defining a set of illumination settings to be utilized to image said reticle;
    performing an optical simulation of a plurality of lines having different pitches based on said set of illumination settings;
    determining the optimal position of said scatter bars relative to said plurality of lines so as to optimize the imaging of said plurality of lines for said illumination settings; and
    recording said optimal position of said scatter bars.

3. The method of generating a rule set utilized for automatically applying optical proximity correction techniques to a reticle design containing a plurality of features according to claim 2, wherein a scatter bar requirement is defined for each of a plurality of distinct feature pitch intervals.

4. The method of generating a rule set utilized for automatically applying optical proximity correction techniques to a reticle design containing a plurality of features according to claim 1, wherein said step of generating said second set of rules comprises the steps of:
    generating a test reticle containing a set of selected test structures and a resist;
    imaging said test reticle on a substrate utilizing said illumination settings and an imaging system to be utilized to image said reticle;
    measuring the critical dimensions of said set of selected test structures imaged on said substrate;
    generating a model representing the printing performance of said imaging system and said resist based on the difference between the set of selected test structures and the imaged set of selected test structures; and
    utilizing said model to define said second set of rules for applying biasing to said plurality of features.

5. The method of generating a rule set utilized for automatically applying optical proximity correction techniques to a reticle design containing a plurality of features according to claim 4, wherein a biasing requirement is defined for each of a plurality of distinct feature pitch intervals based on said model.

6. The method of generating a rule set utilized for automatically applying optical proximity correction techniques to a reticle design containing a plurality of features according to claim 5, wherein placement of a scatter bar within a given pitch interval is considered when defining the biasing requirement for the given pitch interval.

7. The method of generating a rule set utilized for automatically applying optical proximity correction techniques to a reticle design containing a plurality of features according to claim 1, further comprising generating a third set of rules for applying line end correct to said plurality of features.

8. A method of automatically applying optical proximity correction techniques to a reticle design containing a plurality of features, said method comprising the steps of:
    generating a first set of rules for applying scatter bar assist features to said plurality of features for a given illumination setting, said first set of rules being generated utilizing a simulation process;
    generating a second set of rules for applying biasing to said plurality of features for said given illumination setting, said second set of rules being generated utilizing a model representing printing performance;
    forming a look-up table containing said first set of rules and said second set of rules; and
    analyzing each of said plurality of features with said first set of rules and said second set of rules contained in said look-up table to determine if either said first set of rules or said second set of rules is applicable to a given feature;

wherein, if either said first set of rules or said second set of rules is applicable to said given feature, said given feature is modified in accordance with the applicable rule.

9. The method of automatically applying optical proximity correction techniques to a reticle design containing a plurality of features according to claim 8, wherein said step of generating said first set of rules comprises the steps of:

defining a set of illumination settings to be utilized to image said reticle;

performing an optical simulation of a plurality of lines having different pitches based on said set of illumination settings;

determining the optimal position of said scatter bars relative to said plurality of lines so as to optimize the imaging of said plurality of lines for said illumination settings; and recording said optimal position of said scatter bars.

10. The method of automatically applying optical proximity correction techniques to a reticle design containing a plurality of features according to claim 9, wherein a scatter bar requirement is defined for each of a plurality of distinct feature pitch intervals.

11. The method of automatically applying optical proximity correction techniques to a reticle design containing a plurality of features according to claim 8, wherein said step of generating said second set of rules comprises the steps of:

generating a test reticle containing a set of selected test structures and a resist;

imaging said test reticle on a substrate utilizing said illumination settings and an imaging system to be utilized to image said reticle;

measuring the critical dimensions of said set of selected test structures imaged on said substrate;

generating a model representing the printing performance of said imaging system and said resist based on the difference between the set of selected test structures and the imaged set of selected test structures; and utilizing said model to define said second set of rules for applying biasing to said plurality of features.

12. The method of automatically applying optical proximity correction techniques to a reticle design containing a plurality of features according to claim 11, wherein a biasing requirement is defined for each of a plurality of distinct feature pitch intervals based on said model.

13. The method of automatically applying optical proximity correction techniques to a reticle design containing a plurality of features according to claim 12, wherein placement of a scatter bar within a given pitch interval is considered when defining the biasing requirement for the given pitch interval.

14. The method of automatically applying optical proximity correction techniques to a reticle design containing a plurality of features according to claim 8, further comprising generating a third set of rules for applying line end correct to said plurality of features.

15. A computer program product for controlling a computer comprising a recording medium readable by the computer, means recorded on the recording medium for directing the computer to generate a rule set utilized for automatically applying optical proximity correction techniques to a reticle design containing a plurality of features, said generation of said rule set comprising the steps of:

generating a first set of rules for applying scatter bar assist features to said plurality of features for a given illumination setting, said first set of rules being generated utilizing a simulation process;

generating a second set of rules for applying biasing to said plurality of features for said given illumination setting, said second set of rules being generated utilizing a model representing printing performance; and forming a look-up table containing said first set of rules and said second set of rules.

16. The computer program product according to claim 15, wherein said step of generating said first set of rules comprises the steps of:

defining a set of illumination settings to be utilized to image said reticle;

performing an optical simulation of a plurality of lines having different pitches based on said set of illumination settings;

determining the optimal position of said scatter bars relative to said plurality of lines so as to optimize the imaging of said plurality of lines for said illumination settings; and recording said optimal position of said scatter bars.

17. The computer program product according to claim 16, wherein a scatter bar requirement is defined for each of a plurality of distinct feature pitch intervals.

18. The computer program product according to claim 15, wherein said step of generating said second set of rules comprises the steps of:

generating a test reticle containing a set of selected test structures and a resist;

imaging said test reticle on a substrate utilizing said illumination settings and an imaging system to be utilized to image said reticle;

measuring the critical dimensions of said set of selected test structures imaged on said substrate;

generating a model representing the printing performance of said imaging system and said resist based on the difference between the set of selected test structures and the imaged set of selected test structures; and utilizing said model to define said second set of rules for applying biasing to said plurality of features.

19. The computer program product according to claim 18, wherein a biasing requirement is defined for each of a plurality of distinct feature pitch intervals based on said model.

20. The computer program product according to claim 19, wherein placement of a scatter bar within a given pitch interval is considered when defining the biasing requirement for the given pitch interval.

* * * * *